US012672386B2

(12) United States Patent
Oh et al.

(10) Patent No.: US 12,672,386 B2
(45) Date of Patent: Jun. 30, 2026

(54) CHIP WET-TRANSFERRING DEVICE

(71) Applicant: SAMSUNG ELECTRONICS CO., LTD., Suwon-si (KR)

(72) Inventors: Youngtek Oh, Suwon-si (KR);
Kyungwook Hwang, Suwon-si (KR);
Dongkyun Kim, Suwon-si (KR);
Dongho Kim, Suwon-si (KR);
Joonyong Park, Suwon-si (KR);
Sanghoon Song, Suwon-si (KR);
Minchul Yu, Suwon-si (KR); Junsik Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 431 days.

(21) Appl. No.: 18/198,089

(22) Filed: May 16, 2023

(65) Prior Publication Data

US 2024/0178342 A1 May 30, 2024

(30) Foreign Application Priority Data

Nov. 29, 2022 (KR) ........................ 10-2022-0163252

(51) Int. Cl.
H10H 20/01 (2025.01)
(52) U.S. Cl.
CPC .................................. H10H 20/01 (2025.01)
(58) Field of Classification Search
CPC ...................................................... H10H 20/01
USPC ......................................................... 438/22
See application file for complete search history.

(56) References Cited

U.S. PATENT DOCUMENTS

| | | | |
|---|---|---|---|
| 10,242,977 B2 | 3/2019 | Sasaki et al. | |
| 2017/0133558 A1 | 5/2017 | Sasaki et al. | |
| 2018/0102352 A1 | 4/2018 | Sasaki et al. | |
| 2019/0326144 A1 | 10/2019 | Shim et al. | |
| 2022/0013400 A1 | 1/2022 | Hwang et al. | |
| 2022/0077345 A1* | 3/2022 | Chen ..................... | H01L 25/075 |
| 2022/0189810 A1 | 6/2022 | Hwang et al. | |
| 2023/0043559 A1* | 2/2023 | Kim ..................... | H10H 29/012 |
| 2023/0154769 A1 | 5/2023 | Kim et al. | |
| 2023/0317491 A1* | 10/2023 | Kim ..................... | H10H 20/01 |
| | | | 361/234 |

FOREIGN PATENT DOCUMENTS

KR 2020-0014867 A 2/2020

* cited by examiner

*Primary Examiner* — Norman D Richards
*Assistant Examiner* — Colin Russell Mccutcheon
(74) *Attorney, Agent, or Firm* — Sughrue Mion, PLLC

(57) ABSTRACT

A chip wet-transferring device includes a chamber, a support member provided in the chamber and configured to support a transfer substrate, the transfer substrate including a plurality of grooves and on which a plurality of micro-semiconductor chips are disposed, and a magnetic field generator configured to remove a first micro-semiconductor chip from among the plurality of micro-semiconductor chips that is disposed on the transfer substrate and at least partially outside of the plurality of grooves on the transfer substrate by generating a magnetic field that moves the first micro-semiconductor chip in a direction substantially parallel with an upper surface of the transfer substrate.

20 Claims, 23 Drawing Sheets

FIG. 9

CHIP WET-TRANSFERRING DEVICE

CROSS-REFERENCE TO RELATED APPLICATION

This application is based on and claims priority under 35 U.S.C. § 119 to Korean Patent Application No. 10-2022-0163252, filed on Nov. 29, 2022, in the Korean Intellectual Property Office, the disclosure of which is incorporated by reference herein in its entirety.

BACKGROUND

1. Field

The disclosure relates to a chip wet-transferring device.

2. Description of Related Art

Liquid crystal displays (LCDs), organic light-emitting diode (OLED) displays, etc., have been widely used as display devices. Recently, technologies for manufacturing high-resolution display devices using micro-light-emitting diodes are in high demand.

Micro-semiconductor chips, for example, light-emitting diodes (LEDs), have advantages of low power consumption and eco-friendliness. Due to such advantages, industrial demand for LEDs has increased. LEDs are used not only in lighting devices or LCD backlight but also in LED display devices. That is, display devices using micro-sized LED chips have been developed. In manufacturing micro-LED display devices, transferring a micro-LED to a substrate is required. A pick and place method is used in the related art as a method of transferring micro-LEDs. However, as a size of micro-LEDs decreases while a size of displays increases, the pick and place method may result in loss of productivity.

SUMMARY

Provided is a device configured to transfer a micro-semiconductor chip by a wet method.

Additional aspects will be set forth in part in the description which follows and, in part, will be apparent from the description, or may be learned by practice of the presented embodiments of the disclosure.

According to an aspect of the disclosure, a chip wet-transferring device may include a chamber, a support member provided in the chamber and configured to support a transfer substrate, the transfer substrate including a plurality of grooves and on which a plurality of micro-semiconductor chips are disposed, and a magnetic field generator configured to remove a first micro-semiconductor chip from among the plurality of micro-semiconductor chips that is disposed on the transfer substrate and at least partially outside of the plurality of grooves on the transfer substrate by generating a magnetic field that moves the first micro-semiconductor chip in a direction substantially parallel with an upper surface of the transfer substrate.

The magnetic field generator may be further configured to move the first micro-semiconductor chip to a space between the transfer substrate and a lateral surface of the chamber using the magnetic field.

A size of a space between the transfer substrate and a lateral surface of the chamber may be greater than a size of the first micro-semiconductor chip.

The magnetic field generator may be further configured to provide the magnetic field in the direction that is substantially parallel with the upper surface of the transfer substrate.

The magnetic field generator may be further configured to provide the magnetic field in a direction substantially perpendicular to the upper surface of the transfer substrate.

The device may include an actuator configured to move the magnetic field generator in the direction that is substantially parallel with the upper surface of the transfer substrate.

The device may include a separation film provided under the magnetic field generator.

The magnetic field generator may be provided outside the chamber.

The magnetic field generator may be provided outside of a lateral surface of the chamber.

The magnetic field generator may include an electromagnet configured to generate the magnetic field based on an applied electric signal.

The magnetic field generator may include a plurality of cells, and each of the plurality of cells is configured to independently generating a magnetic field.

A side of a cell of the plurality of cells may be less than a size of the first micro-semiconductor chip.

The device may include a liquid supply module configured to supply liquid to the transfer substrate and that at least partially covers the first micro-semiconductor chip.

The liquid supply module may be further configured to supply the liquid such that a distance from the upper surface of the transfer substrate to a surface of the liquid is greater than a size of the first micro-semiconductor chip.

At least one of the support member and the magnetic field generator may be configured to perform at least one of a rotary motion, a tilt motion, a vibratory motion, a vertical motion, and a horizontal motion.

A first adhesive force at the upper surface of the transfer substrate or a first surface energy density at the upper surface of the transfer substrate may be less than a second adhesive force at at least one groove of the plurality of grooves or a second surface energy density at the at least one groove of the plurality of grooves.

A convex pattern may be formed on the upper surface of the transfer substrate,

A width of the convex pattern may be less than a width of the first micro-semiconductor chip.

The first micro-semiconductor chip may be a light-emitting device comprising an electrode provided on a surface of the light-emitting device, and the electrode may include a magnetic material.

According to an aspect of the disclosure, a method of chip wet-transferring may include providing a transfer substrate including a plurality of grooves and on which a plurality of micro-semiconductor chips are disposed, supporting the transfer substrate with a support member, accommodating the support member in a chamber and removing a first micro-semiconductor chip from among the plurality of micro-semiconductor chips that is disposed on the transfer substrate and at least partially outside of the plurality of grooves on the transfer substrate by generating a magnetic field that moves the first micro-semiconductor chip in a direction substantially parallel with an upper surface of the transfer substrate.

Moving the first micro-semiconductor chip may include moving the first micro-semiconductor chip to a space between the transfer substrate and a lateral surface of the chamber using the magnetic field.

The magnetic field may be provided in a direction substantially perpendicular to the upper surface of the transfer substrate.

The magnetic field may be generated by a magnetic field generator.

The magnetic field generator may include a plurality of cells independently generating a plurality of magnetic fields.

Moving the first micro-semiconductor chip may include moving the magnetic field generator in the direction that is substantially parallel with the upper surface of the transfer substrate.

The magnetic field generator may include an electromagnet configured to generate the magnetic field based on an applied electric signal.

BRIEF DESCRIPTION OF DRAWINGS

The above and other aspects, features, and advantages of certain embodiments of the disclosure will be more apparent from the following description taken in conjunction with the accompanying drawings, in which:

FIG. 9 is a diagram illustrating a state where liquid is supplied by a liquid supply module according to an embodiment;

DETAILED DESCRIPTION

Figure 1:
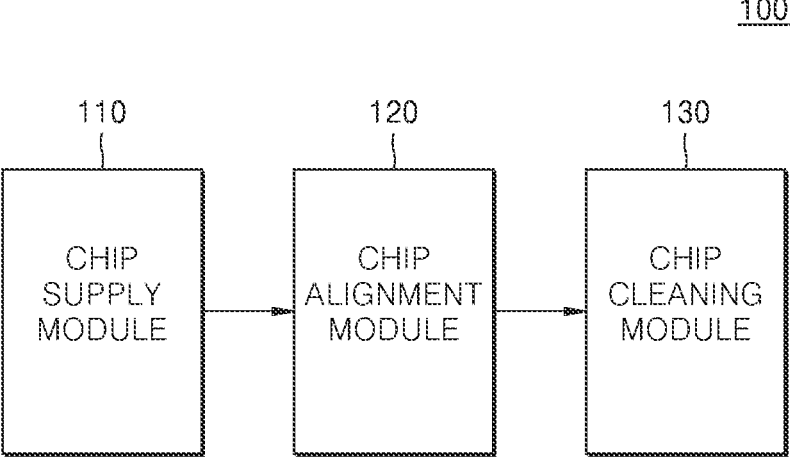
FIG. 1 is a diagram of a chip wet-transferring device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a chip wet-transferring device is described in detail with reference to the attached drawings. In the drawings, like reference numerals denote like components, and sizes of components may be exaggerated for clarity and convenience of explanation. While such terms as "first," "second," etc., may be used to describe various components, such components must not be limited to the above terms. The above terms are used only to distinguish one component from another.

An expression used in the singular encompasses the expression of the plural, unless it has a clearly different meaning in the context. When a portion "includes" a component, another component may be further included, rather than excluding the existence of the other component, unless otherwise described. Sizes or thicknesses of components in the drawings may be arbitrarily exaggerated for convenience of explanation. Further, when a certain material layer is described as being arranged on a substrate or another layer, the material layer may contact the other layer, or there may be a third layer between the material layer and the other layer. In embodiments, materials constituting each layer are provided merely as an example, and other materials may also be used.

Also, the terms " . . . portion," "module," etc. used in the specification may refer to a unit performing at least one function or operation, and may be implemented by a hardware, a software, or a combination thereof.

The particular implementations shown and described herein are illustrative examples of embodiments and are not intended to otherwise limit the scope of embodiments in any way. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of the terms "a" and "an" and "the" and similar referents in the context of describing embodiments (especially in the context of the following claims) are to be construed to cover both the singular and the plural.

Also, the steps of all methods described herein can be performed in any suitable order unless otherwise indicated herein or otherwise clearly contradicted by context. The use of any and all exemplary languages (e.g., "such as") provided herein, are intended merely to better illuminate the technical ideas and does not pose a limitation on the scope of rights unless otherwise claimed.

Figure 2:
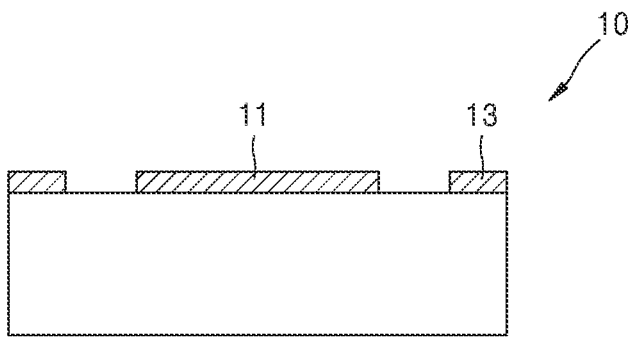
FIG. 2 is a diagram of a micro-semiconductor chip according to an embodiment.
Figure 3A:
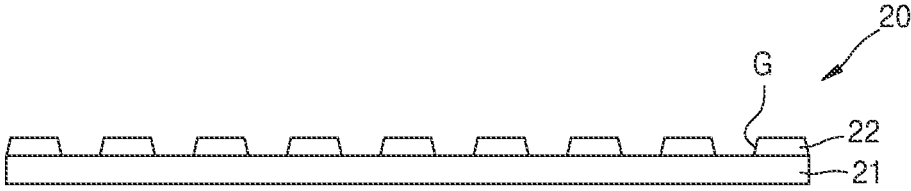
FIG. 3A is a diagram of a transfer substrate including a plurality of grooves according to an embodiment.
Figure 3B:
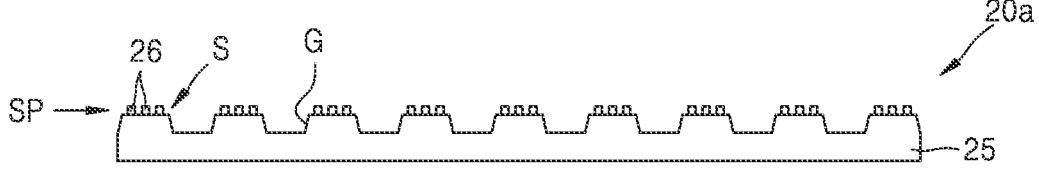
FIG. 3B is a diagram of a transfer substrate including a convex pattern according to an embodiment.

FIG. 1 is a diagram of a chip wet-transferring device 100 according to an embodiment. FIG. 2 is a diagram of a micro-semiconductor chip 10 according to an embodiment. FIGS. 3A and 3B are diagrams of a transfer substrate 20 and 30a including a plurality of grooves G according to an embodiment.

With reference to FIGS. 1 to 3B, the chip wet-transferring device 100 may transfer a plurality of micro-semiconductor chips 10 to the plurality of grooves G of the transfer substrate 20. The chip wet-transferring device 100 may include a chamber and a support member arranged inside the chamber and supporting the transfer substrate 20.

The chip wet-transferring device 100 may include a chip supply module 110 configured to supply the micro-semiconductor chips 10 and liquid (e.g., liquid L of FIG. 4) to the transfer substrate 20, a chip alignment module 120 configured to align the micro-semiconductor chips 10 in the plurality of grooves G, and a chip cleaning module 130 configured to remove remaining micro-semiconductor chips 10 on areas which are not the grooves G of the transfer substrate 20.

The chip supply module 110, the chip alignment module 120, and the chip cleaning module 130 may be arranged individually or altogether inside a chamber 140. Alternatively, the chip wet-transferring device 100 may include a plurality of chambers. For example, the chip wet-transferring device 100 may include a first chamber mounted with the chip supply module 110 and the chip alignment module 120 and a second chamber mounted with the chip cleaning module 130. In this manner, the micro-semiconductor chips 10 are provided to the transfer substrate 20 by the chip supply module 110 and aligned by the chip alignment module 120 in the first chamber, the transfer substrate 20 may be moved to the second chamber, and remaining micro-semiconductor chips may be removed by the chip cleaning module 130.

The micro-semiconductor chip 10 according to an embodiment may be a micro-sized member. For example, a width, a diameter, or a thickness of the micro-semiconductor chip 10 may be less than or equal to about 1000 μm, less than or equal to about 200 μm, less than or equal to about 100 μm, or less than or equal to about 50 μm. The width, the diameter, or the thickness of the micro-semiconductor chip 10 may be greater than or equal to about 1 μm.

The micro-semiconductor chip 10 may be a micro-light-emitting diode (LED). However, the micro-semiconductor chip 10 is not limited thereto, and may be any micro-sized members. For example, the micro-semiconductor chip 10 may be a semiconductor device, a pressure sensor, a photodiode, a thermistor, a piezoelectric element, etc.

The micro-semiconductor chip 10 may have a symmetrical plane shape. For example, plane shape of the micro-semiconductor chip 10 may be square, circular, triangular, or hexagonal.

With reference to FIG. 2, an electrode may be arranged on an end portion of the micro-semiconductor chip 10. Electrodes of the micro-semiconductor chip 10 may have a symmetrical structure. For example, a first electrode 11 of the micro-semiconductor chip 10 may be arranged at the center of the micro-semiconductor chip 10, and a second electrode 13 may be arranged apart from the first electrode 11 and further to the outside of the micro-semiconductor chip 10 than the first electrode 11. As such, when the micro-semiconductor chip 10 rotates in a subsequent process of aligning the micro-semiconductor chip 10 in the grooves G, the electrode 13 of the micro-semiconductor chip 10 may be arranged at a certain position. The electrodes 11 and 13 may include a magnetic material. For examples, the electrode may include a metal such as NI, Fe, Co, Gd, etc., or include an alloy such as permalloy, magnetite (e.g., Fe3 O4), etc.

With reference to FIG. 3A, the transfer substrate 20 may include a plurality of grooves G into which the micro-semiconductor chips 10 may be inserted. Each of the plurality of grooves G may have a size in which at least some of the micro-semiconductor chips 10 may be inserted. For example, the groove G may have be micro-size. For example, the size of the groove G may be less than about 1000 μm, for example, less than or equal to about 500 μm, less than or equal to about 200 μm, or less than or equal to about 100 μm. The size of the groove G may be greater than the size of the micro-semiconductor chip 10.

A distance between the plurality of grooves G may correspond to a distance between the micro-semiconductor chips 10 inserted in the grooves G. For example, when the micro-semiconductor chip 10 is a light-emitting device, a distance between the plurality of grooves G may correspond to a pixel distance of a display device used in a final product. However, the distance between the plurality of grooves G is not limited thereto, and may vary according to various implementations.

The transfer substrate 20 may include multiple layers. For example, the transfer substrate 20 may include a base substrate 21 and a guide mold 22. The base substrate 21 and the guide mold 22 may include the same material or different materials from each other. Alternatively, the transfer substrate 20 may include a single layer. A plane shape of the transfer substrate 20 may be rectangular. However, the disclosure is not limited thereto, and the plane shape of the transfer substrate 20 may be circular.

The transfer substrate 20 applied to the chip wet-transferring device 100 according to an embodiment may include the plurality of grooves G. Moreover, the grooves G and an upper surface S of the transfer substrate 20 may have different adhesive forces or surface energy densities from each other. An upper surface of the guide mold 22 may have an uneven pattern to diminish the adhesive force to a micro-semiconductor chip or may be a rough surface, and thus, the guide mold 22 may be formed of a material to which the micro-semiconductor chip adheres. On the contrary, a lower surface of the groove (that is, the base substrate 21) may be surface-treated with a material reinforcing the adhesive force to the micro-semiconductor chip. For example, the grooves G may be surface-treated with a hydrophilic material, and the upper surface S may be surface-treated with a hydrophobic material. Alternatively, the upper surface S of the transfer substrate 20 may be physically patterned to vary the adhesive force or the surface energy density.

FIG. 3B is a diagram of a transfer substrate 20a including a convex pattern according to an embodiment. With reference to FIG. 3B, the transfer substrate 20a may include a body 25 including a plurality of grooves G and a surface energy decrease pattern SP including a plurality of convex patterns formed between the grooves G on an upper surface S of the body 25. In the embodiment, the surface energy decrease pattern SP may include a plurality of convex patterns 26 arranged on the upper surface S of the body 25.

The surface energy decrease pattern SP including the plurality of convex patterns 26 formed on the transfer substrate 20a may decrease the surface energy of the upper surface S of the body 25 connected to the grooves G to prevent the micro-semiconductor chip 10 from being fixed onto the upper surface S of the body 25. In other words, as it becomes easier for the micro-semiconductor chips 10 to slide on the upper surface S of the body 25 due to the surface energy decrease pattern SP, the micro-semiconductor chips 10 may move into the groove G without being attached to positions other than their right positions. In general, the surface energy of an interface between to contacting surfaces is proportional to a contact area. When the convex patterns 26 are provided, the surface energy of an interface between the bottom surface of the micro-semiconductor chip 10 and the transfer substrate 20a may be lowered, and the micro-semiconductor chip 10 may easily move into the groove G. In addition, as the adhesive force or surface energy density between the convex patterns 26 and the micro-semiconductor chips 10 is low, when a magnetic field is applied, the micro-semiconductor chips 10 may be easily separated from the convex patterns 26.

The width of the convex patterns 26 and the distance between the convex patterns 26 may be set such that the micro-semiconductor chips 10 are not fixed on the convex patterns 26 and the path of the micro-semiconductor chips 10 towards the grooves G is not interrupted by the micro-semiconductor chips 10 being held by the convex patterns 26. Although a cross-section of the convex patterns 26 is described as circular, this is just an example. The cross-section of the convex patterns 26 may be changed to various shapes, including a polygonal shape, a ring shape, or any other shapes.

For example, the width of the convex patterns 26 may be less than the width of the micro-semiconductor chips 10, and the width of the micro-semiconductor chips 10 may be less than the grooves G into which the micro-semiconductor chips 10 are arranged. A width w1 of the micro-semiconductor chip 10 may be less than or equal to about 95% or about 80% of a width w1 of the groove G or greater than or equal to about 50% of the width w1 of the groove G. To reduce the surface energy at the interface between the convex patterns 26 and the micro-semiconductor chips 10, for example, the width of the convex patterns 26 may be set to be less than or equal to about 50%, about 30%, or about 10% of the width of the micro-semiconductor chips 10.

Figure 4:
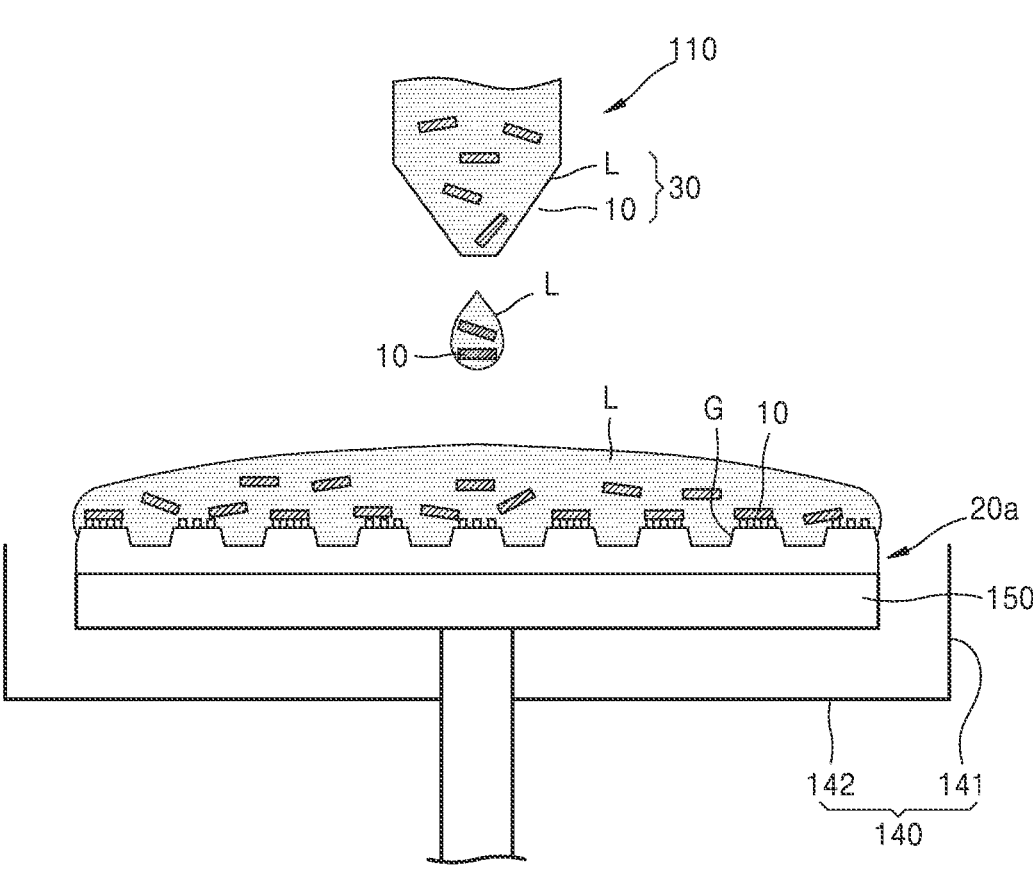
FIG. 4 is a diagram illustrating a method of supplying a micro-semiconductor chip to a transfer substrate by a chip supply module according to an embodiment.

FIG. 4 is a diagram illustrating a method of supplying the micro-semiconductor chip 10 to the transfer substrate 20a by the chip supply module 110 according to an embodiment.

The chip supply module 110 may supply a suspension 30 including the liquid L and the micro-semiconductor chips 10. The chip supply module 110 may supply the suspension 30 including the liquid L and the plurality of micro-semiconductor chips 10 onto the transfer substrate 20a such that the plurality of micro-semiconductor chips 10 are movable on the transfer substrate 20a.

When the suspension 30 is supplied to the transfer substrate 20a, the liquid L included in the suspension 30 may form a thin film on the transfer substrate 20a and at least some of the plurality of micro-semiconductor chips 10 may be submerged in the liquid L as illustrated in FIG. 4.

As the plurality of micro-semiconductor chips 10 are submerged in the liquid L, they may move on the transfer substrate 20a. The liquid L supplied on the transfer substrate 20a may be formed thin on the transfer substrate 20a such that the plurality of micro-semiconductor chips 10 may move but unintended flow by the chip alignment module 120 to be described may be prevented or minimized.

For example, the liquid L may remain on the transfer substrate 20a without an additional component for keeping the liquid L on the transfer substrate 20a (e.g., a water tank, etc.). The liquid L supplied on the transfer substrate 20a may have a convex surface upwards formed due to the surface tension. The height of the liquid L may decrease towards an edge of the transfer substrate 20a. The height of the liquid L supplied on the transfer substrate 20a may be up to about 20 times greater than the thickness of the micro-semiconductor chip 10. The height of the liquid L supplied on the transfer substrate 20a may be up to about 10 times greater than the thickness of the micro-semiconductor chip 10. The height of the liquid L supplied on the transfer substrate 20a may be up to about 5 times greater than the thickness of the micro-semiconductor chip 10. The height of the liquid L supplied on the transfer substrate 20a may be up to about 2 times greater than the thickness of the micro-semiconductor chip 10. The height of the liquid L may be an average height.

Any type of liquid that does not corrode or damage the micro-semiconductor chips 10 may be used as the liquid L. The liquid L may include, for example, at least one of water, ethanol, alcohol, polyol, ketone, halocarbon, acetone, flux, and organic solvent. The organic solvent may include, for example, isopropyl alcohol (IPA). The liquid L is not limited thereto and may vary.

The embodiment is described focusing on the case where the chip supply module 110 supplies the micro-semiconductor chips 10 in the form of suspension 30. However, the disclosure is not limited thereto. For example, the chip supply module 110 may supply the plurality of micro-semiconductor chips 10 without liquid L. The chip supply module 110 may include a separate module to supply the liquid L and may supply the plurality of micro-semiconductor chips 10 without any liquid L.

The chip alignment module 120 may include an absorber (e.g., absorber 121 of FIG. 5) to absorb the liquid L. The transfer substrate 20a may be scanned using the absorber. The chip alignment module 120 may move the absorber along the surface of the transfer substrate 20a. The absorber may move along the surface of the transfer substrate 20a while contacting the transfer substrate 20a.

Figure 5:
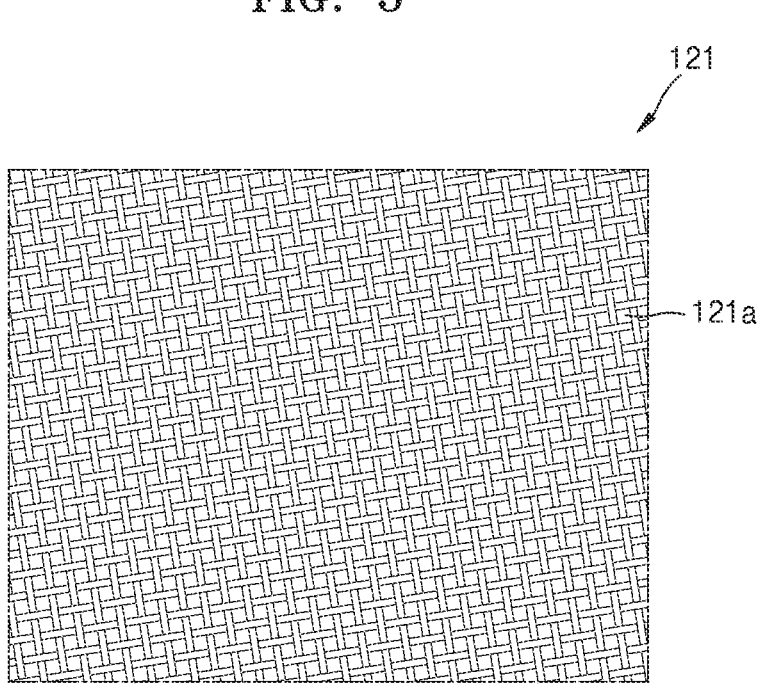
FIG. 5 is a diagram of an example of an absorber according to an embodiment.

FIG. 5 is a diagram of an example of the absorber 121 according to an embodiment. The absorber 121 may include, for example, fabric, tissue, fiber, paper, wiper, etc. Natural fiber, such as cotton, silk, etc. or artificial fiber, such as nylon, polyester, acryl, etc. may be used as the fabric. Any material capable of absorbing the liquid L may be suitable for the absorber 121, and the disclosure is not limited to the foregoing. For example, micro-denier wipers may be used as the absorber 121. Micro-wipers may have a thickness less than or equal to 0.5 denier and may have a greater liquid L absorption rate than cotton. The absorber 121 may be woven or knitted.

Wefts in the horizontal direction and the warps in the vertical directions are tangled with each other to a woven fabric, and such woven fabric may have a relatively greater strength than a knitted fabric. The absorber 121 may have a mesh structure capable of capable of absorbing the liquid L. The absorber 121 may have a plurality of mesh holes (e.g., hole 121a) and a size of such mesh holes may be smaller than the micro-semiconductor chips 10 to prevent the micro-semiconductor chip 10 from being stuck or caught in the mesh hole.

The absorber 121 may be solely used without other assist devices. However, the disclosure is not limited thereto, and the absorber 121 may be coupled to a support 122 to facilitate the scanning of the transfer substrate 20a by the absorber 121.

Figure 6:
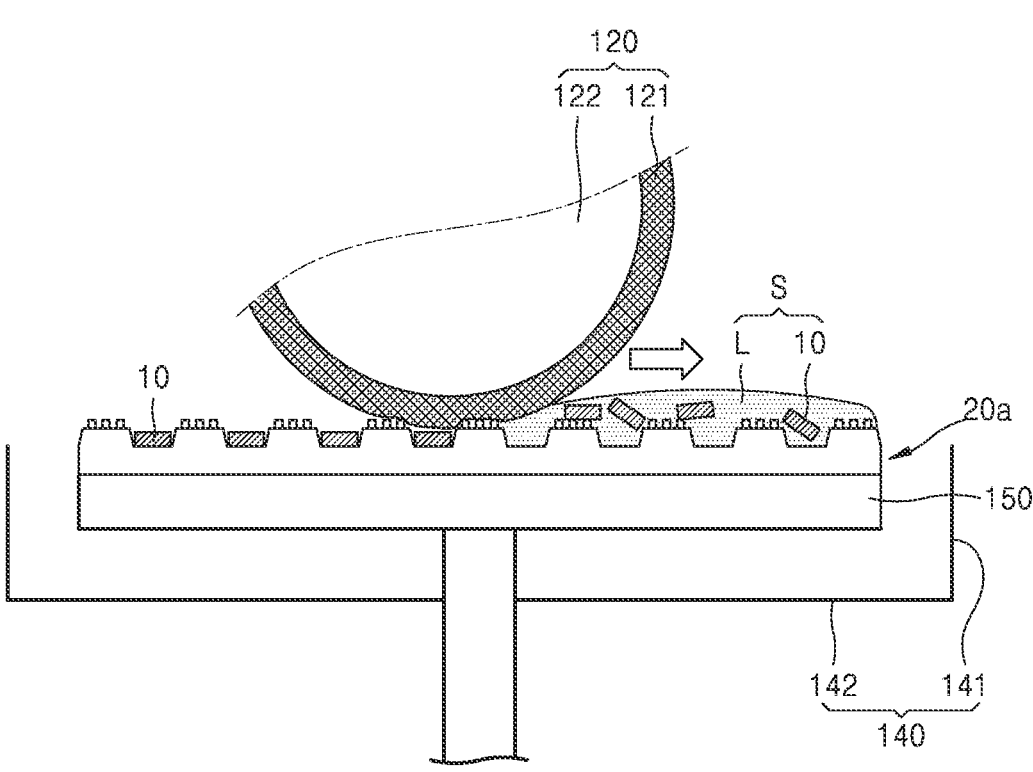
FIG. 6 is a diagram of a chip alignment module according to an embodiment.

FIG. 6 is a referential diagram of the chip alignment module 120 according to an embodiment. The chip alignment module 120 may scan the transfer substrate 20a while the absorber 121 applies proper pressure to the transfer substrate 20a. During the scanning by the chip alignment module 120, the absorber 121 may contact the transfer substrate 20a and go past the plurality of grooves G. During the scanning, the liquid L may be absorbed by the absorber 121.

The scanning of the transfer substrate 20a by the absorber 121 may include absorbing the liquid L in the plurality of grooves G by the absorber 121 going past the plurality of grooves G. When the absorber 121 goes past the grooves G, the liquid L in the grooves G may be absorbed, and the micro-semiconductor chips 10 may be arranged in the grooves G in the process.

With reference to FIG. 6, the chip alignment module 120 may include the absorber 121 contacting the transfer substrate 20a to absorb the liquid L and the support 122 supporting the absorber 121. The support 122 may have various shapes and structures suitable for scanning of the transfer substrate 20a. The support 122 may include, for example, a rod, a blade, a plate, a wiper, etc. The absorber 121 may be provided on one side of the support 122 or the absorber 121 may be wound around the support 122.

The chip alignment module 120 may scan the transfer substrate 20a while the absorber 121 applies proper pressure to the transfer substrate 20a. In the scanning process, the absorber 121 may contact the transfer substrate 20a and go past the plurality of grooves G. During the scanning, the liquid L may be absorbed by the absorber 121.

The scanning may be performed by various methods including at least one of a sliding method, a rotating method, a translating motion method, a reciprocating motion method, a rolling method, a spinning method, and a rubbing method of the absorber 121, and may include both of regular methods and irregular methods. Alternatively, the scanning may include at least one of a rotating motion, a translating motion, a rolling motion, and a spinning motion of the transfer substrate 20a. The scanning may be performed by cooperation of the absorber 121 and the transfer substrate 20a. For example, when the absorber 121 applies pressure to the transfer substrate 20a, the transfer substrate 20a may move or rotate for scanning.

After the micro-semiconductor chips 10 are aligned on the transfer substrate 20a, the micro-semiconductor chips 10 which are not arranged in the grooves G may be moved and/or removed. That is, the micro-semiconductor chips 10 that are arranged on the transfer substrate 20a but are at least partially outside the grooves G (e.g., not arranged in any groove G, partially arranged within a groove G, other arrangements with respect to any of the grooves G that does not satisfy the requirements/preferences of the particular implementation, etc.) may be moved to different positions of the transfer substrate 20a and/or removed from the transfer substrate 20a as is described below. For convenience in explanation, the micro-semiconductor chips 10 arranged in the grooves G of the transfer substrate 20a may be referred to as first micro-semiconductor chips, and the micro-semiconductor chips 10 which are arranged in areas other than the grooves G of the transfer substrate 20a, for example, on the upper surface S of the transfer substrate 20a may be referred to as second micro-semiconductor chips.

Figure 7:
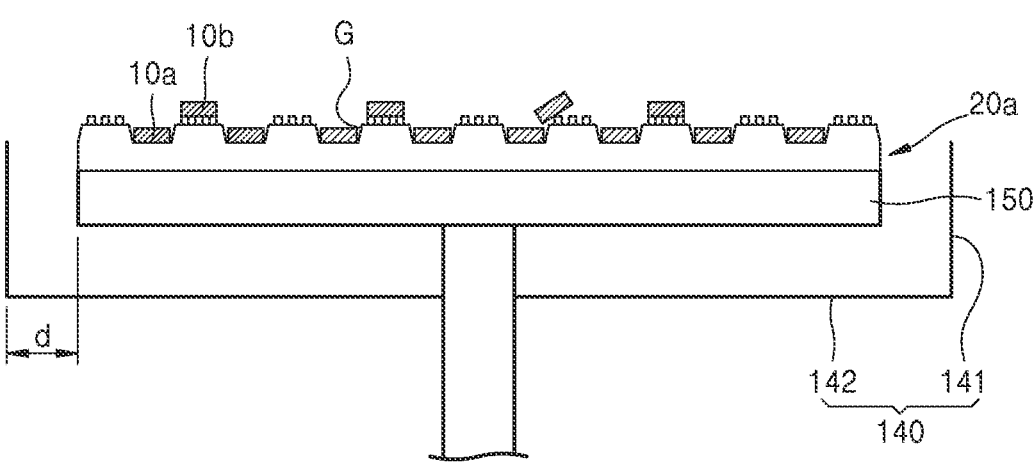
FIG. 7 is a diagram of a chip wet-transferring device including a transfer substrate after micro-semiconductor chips are arranged according to an embodiment.

FIG. 7 is a diagram of a chip wet-transferring device including the transfer substrate 20a after the micro-semiconductor chips 10 are arranged according to an embodiment. The chip wet-transferring device may include a chamber 140 and a support member 150 arranged inside the chamber 140. An upper surface S of the support member 150 may be flat. The transfer substrate 20a may be arranged on the upper surface S of the support member 150. The transfer substrate 20a may be arranged on the support member 150 while being spaced apart from a lateral surface 141 of the chamber 140. A distance d between the transfer substrate 20a and the lateral surface 141 of the chamber 140 may be greater than a size of a second micro-semiconductor chip 10b such that the second micro-semiconductor chip 10b may be separated from the transfer substrate 20a. The size of the second micro-semiconductor chip 10b may be the longest length of the second micro-semiconductor chip 10b.

A first micro-semiconductor chip 10a arranged in the groove G may be a source used when manufacturing a display device, etc., and may be an effective micro-semiconductor chip. The second micro-semiconductor chip 10b which is not arranged in the groove G may be a dummy micro-semiconductor chip which cannot be used in the manufacturing process of devices. Accordingly, the second micro-semiconductor chip 10b may be removed from the transfer substrate 20a.

The second micro-semiconductor chip 10b may be removed using various methods. For example, similar to the chip alignment method, the remaining second micro-semiconductor chip 10b may be scanned using an absorber, a pressure member, etc. In this case, the scanning may need to be performed multiple times to completely remove the second micro-semiconductor chip 10b.

In the scanning process, friction between the micro-semiconductor chips 10 may be generated between the micro-semiconductor chips 10 and the transfer substrate 20a, which may cause damage on the micro-semiconductor chips 10 and the transfer substrate 20a. The degree of damage may be proportional to the number of scanning. That is, when the scanning is performed multiple times, the second micro-semiconductor chip 10b may be removed thoroughly but the micro-semiconductor chips 10 or the transfer substrate 20a may be damaged. On the contrary, when the scanning is performed sufficiently, the second micro-semiconductor chip 10b may not be removed completely.

The chip cleaning module 130 according to an embodiment may include a magnetic field generator configured to provide a magnetic field to the chip wet-transferring device to remove the second micro-semiconductor chip 10b. As the magnetic field generator removes the second micro-semiconductor chip 10b from the transfer substrate 20a while not directly contacting the micro-semiconductor chips 10 and the transfer substrate 20a, the micro-semiconductor chips 10 and the transfer substrate 20a may not be damaged.

Figure 8:
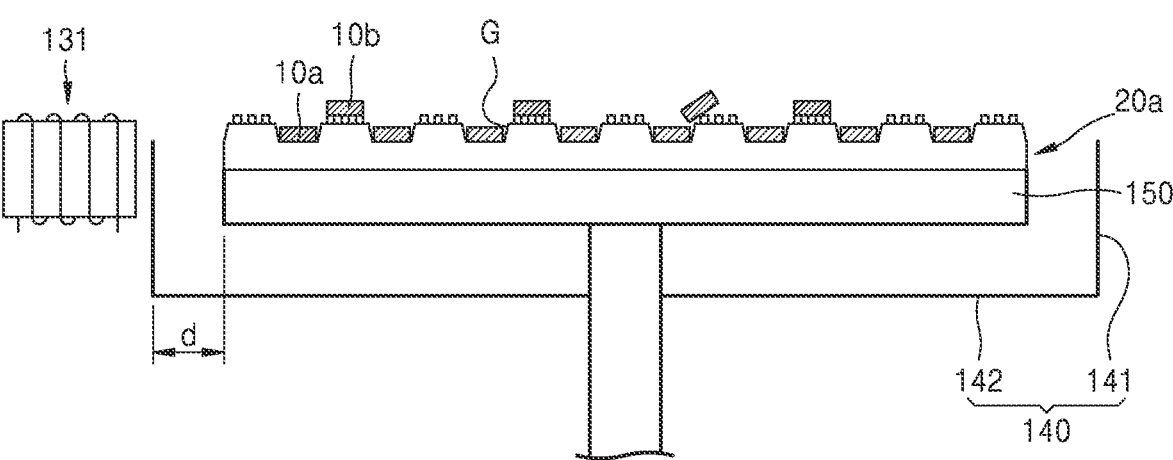
FIG. 8 is a diagram of a chip wet-transferring device including a magnetic field generator according to an embodiment.

FIG. 8 is a diagram of a chip wet-transferring device including a magnetic field generator 131 according to an embodiment. As illustrated in FIG. 8, the magnetic field generator 131 may be arranged outside the chamber 140. For example, the magnetic field generator 131 may be arranged parallel with the lateral surface 141 of the chamber 140 outside the chamber 140. The magnetic field generator 131 may surround at least a part of the lateral surface 141 of the chamber 140. The magnetic field generator 131 may be embedded in the lateral surface 141 of the chamber 140.

The magnetic field generator 131 may include a magnetic material generating a magnetic field regardless of applied electric signals. The magnetic field generator 131 may include an electromagnet or permanent electromagnet generating a magnetic field according to an applied electric signal.

A surface of the magnetic field generator 131 generating a magnetic field may be greater than the size of the groove G of the transfer substrate 20a or the second micro-semiconductor chip 10b. The greater the surface of the magnetic field generator 131 that generates a magnetic field is, the more second micro-semiconductor chips 10b may be removed at a time.

The magnetic field generator 131 may provide to the transfer substrate 20a a magnetic field for moving the second micro-semiconductor chips 10b arranged in areas other than the grooves G (or partially within grooves G) of the transfer substrate 20a while not moving the first micro-semiconductor chips 10a arranged in the grooves G of the transfer substrate 20a. By the magnetic field, the second micro-semiconductor chips 10b may be removed from the transfer substrate 20a. For example, the second micro-semiconductor chips 10b may be moved in a direction parallel with the upper surface S of the transfer substrate 20a and removed from the transfer substrate 20a. The magnetic field generator 131 may move the second micro-semiconductor chips 10b to a space between the transfer substrate 20a and the lateral surface 141 of the chamber 140.

The chip wet-transferring device 100 may further include a liquid supply module 132 configured to supply liquid L onto the transfer substrate 20a to increase the mobility of the second micro-semiconductor chips 10b.

Any type of liquid that does not corrode or damage the micro-semiconductor chips 10 may be used as the liquid L. The liquid L may be identical to the liquid L supplied by the chip supply module 110. However, the disclosure is not limited thereto, and the liquid L may be different from the liquid L supplied by the chip supply module 110.

The liquid L may include, for example, at least one of water, ethanol, alcohol, polyol, ketone, halocarbon, acetone, flux, and organic solvent. The organic solvent may include, for example, IPA. The liquid L is not limited thereto and may vary.

Figure 9:
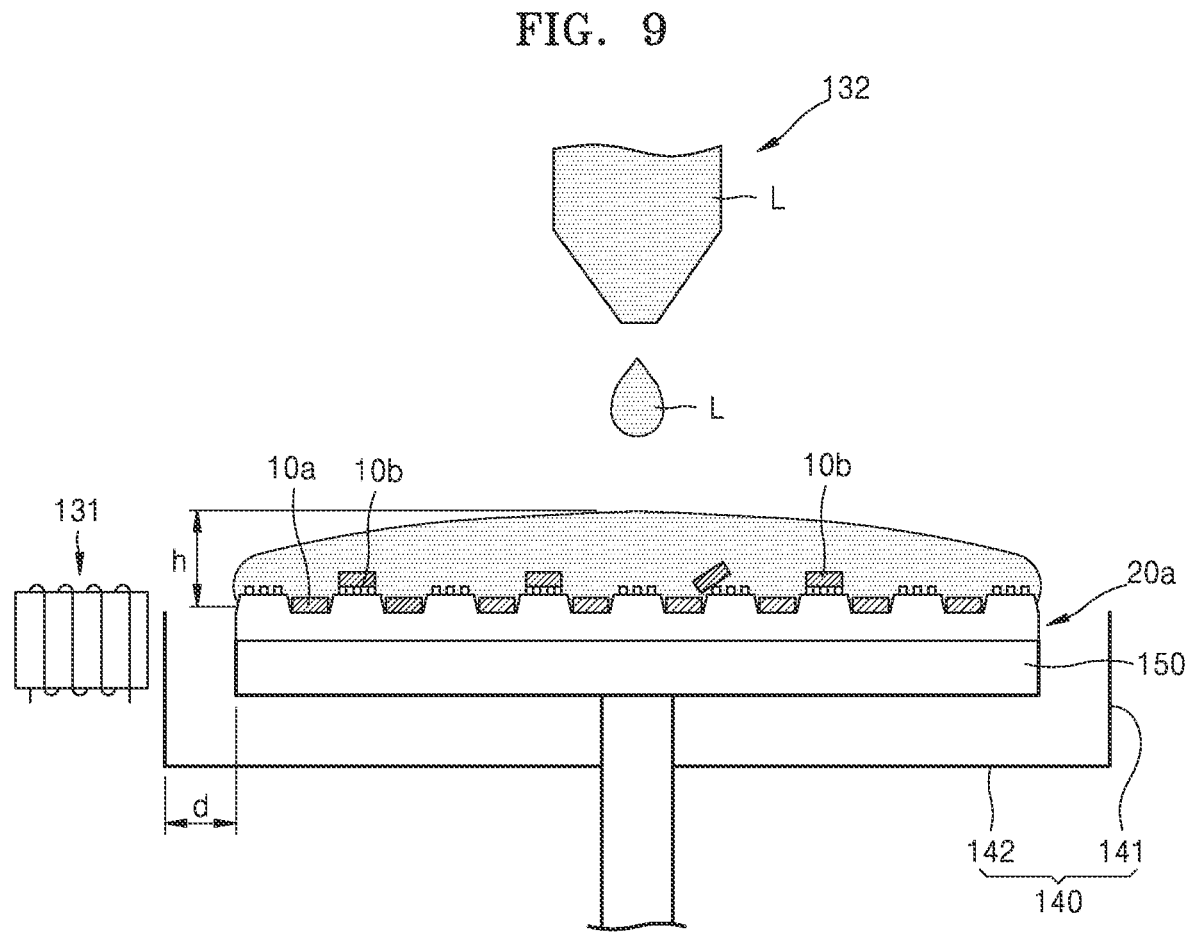

FIG. 9 is a diagram illustrating a state where the liquid L is supplied by the liquid supply module 132 according to an embodiment. As illustrated in FIG. 9, the liquid supply module 132 may supply the liquid L to the transfer substrate 20a. The liquid L may cover the first micro-semiconductor chips 10a arranged in the grooves G of the transfer substrate 20a and the second micro-semiconductor chips 10b arranged on the upper surface S of the transfer substrate 20a other than the grooves G of the transfer substrate 20a. The height h from the upper surface S of the transfer substrate 20a to the upper surface S of the liquid L may be greater than the size of the second micro-semiconductor chip 10b. Accordingly, when the second micro-semiconductor chips 10b move in the liquid L, the friction with the surface of the transfer substrate 20a and other micro-semiconductor chips 10 may be low.

Figure 10A:
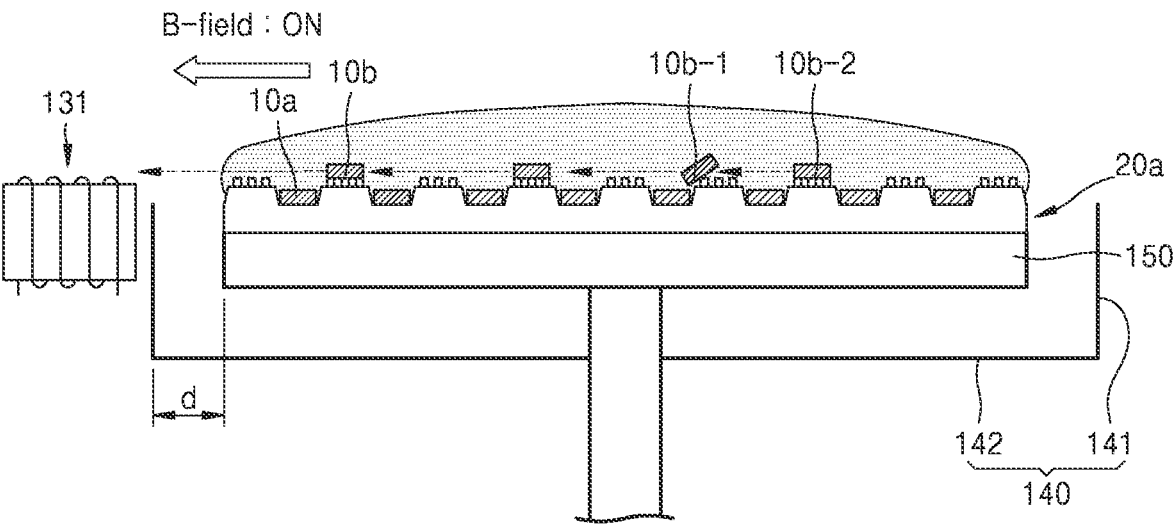
FIG. 10A is a diagram illustrating a state of providing a magnetic field to a transfer substrate according to an embodiment.

FIG. 10A is a diagram illustrating a state where a magnetic field is provided to the transfer substrate 20a according to an embodiment. As illustrated in FIG. 10A, the magnetic field generator 131 may provide to the transfer substrate 20a a magnetic field for moving the second micro-semiconductor chips 10b arranged in areas other than the grooves G of the transfer substrate 20a. The magnetic field generator 131 may provide a magnetic field in a direction parallel with the upper surface S of the transfer substrate 20a. The intensity of the magnetic field may be determined by properties of a magnetic material included in the magnetic field generator 131, a distance between the magnetic field generator 131 and the transfer substrate 20a, an electric signal applied to the magnetic field generator 131, etc. For example, when the magnetic field generator 131 includes a magnet the intensity of a magnetic field may be adjusted by the intensity of an electric signal applied to the magnetic field generator 131.

As the micro-semiconductor chip 10 includes the electrode 13 including a magnetic material, the micro-semiconductor chip 10 may be moved by an attractive force by the magnetic field provided by the magnetic field generator 131. Alternatively, the micro-semiconductor chip 10 may further include other magnetic materials. Due to this, the micro-semiconductor chip 10 may be moved to an area having a great magnetic field by the attractive force by the magnetic field. For example, the second micro-semiconductor chip 10b may move towards the magnetic field generator 131. As the movement of the first micro-semiconductor chips 10a towards the magnetic field generator 131 is blocked by the grooves G, only the second micro-semiconductor chips 10b may move towards the magnetic field generator 131.

Figure 10B:
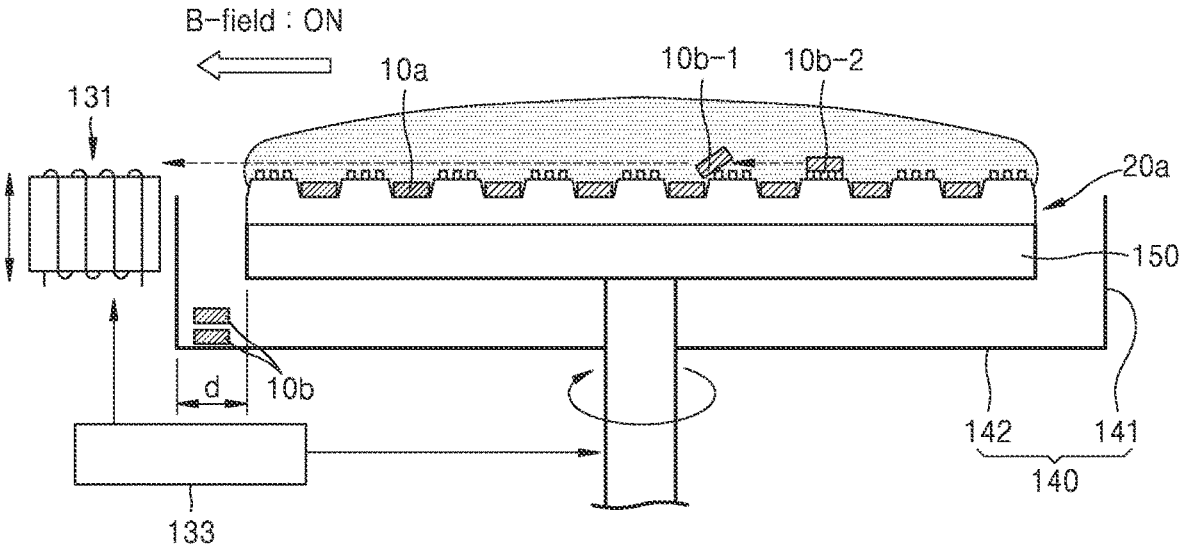
FIG. 10B is a diagram of a chip wet-transferring device including a second micro-semiconductor chip which does not move according to an embodiment.

FIG. 10B is a diagram of a chip wet-transferring device including the second micro-semiconductor chip 10b which does not move according to an embodiment. As illustrated in FIG. 10B, a second micro-semiconductor chip 10b-1 which is abnormally arranged in the groove G may be blocked by the groove and may not move. A second micro-semiconductor chip 10b-2 to which a low magnetic field is applied may not move as well.

The chip wet-transferring device may further include an actuator 133 configured to control movements of the magnetic field generator 131 or the support member. For example, the magnetic field generator 131 may change the state of the magnetic field by a vibrating motion, and such changed in the state of the magnetic field may facilitate the movement of the second micro-semiconductor chip (10b-1, 10b-2). The actuator 133 may control the support member 150 such that the transfer substrate 20a may perform at least one of a rotary motion, a vibratory motion, a tilt motion, a vertical motion, and a horizontal motion.

The second micro-semiconductor chip 10b may move close to the magnetic field generator 131 in a direction parallel with the upper surface S of the transfer substrate 20a. The transfer substrate 20a may be spaced apart from the lateral surface 141 of the chamber 140. The distance d between the transfer substrate 20a and the lateral surface 141 of the chamber 140 may be greater than the size of the second micro-semiconductor chip 10b. When the second micro-semiconductor chip 10b moves to the space between the transfer substrate 20a and the lateral surface 141 of the chamber 140, the magnetic field generator 131 may stop providing the magnetic field. For example, the magnetic field generator 131 move away from the chamber 140 or an electric signal applied to the magnetic field generator 131 may be terminated. The second micro-semiconductor chip 10b placed in the space between the transfer substrate 20a and the lateral surface 141 of the chamber 140 may be moved to a bottom surface 142 of the chamber 140 by the gravity.

Figure 10C:
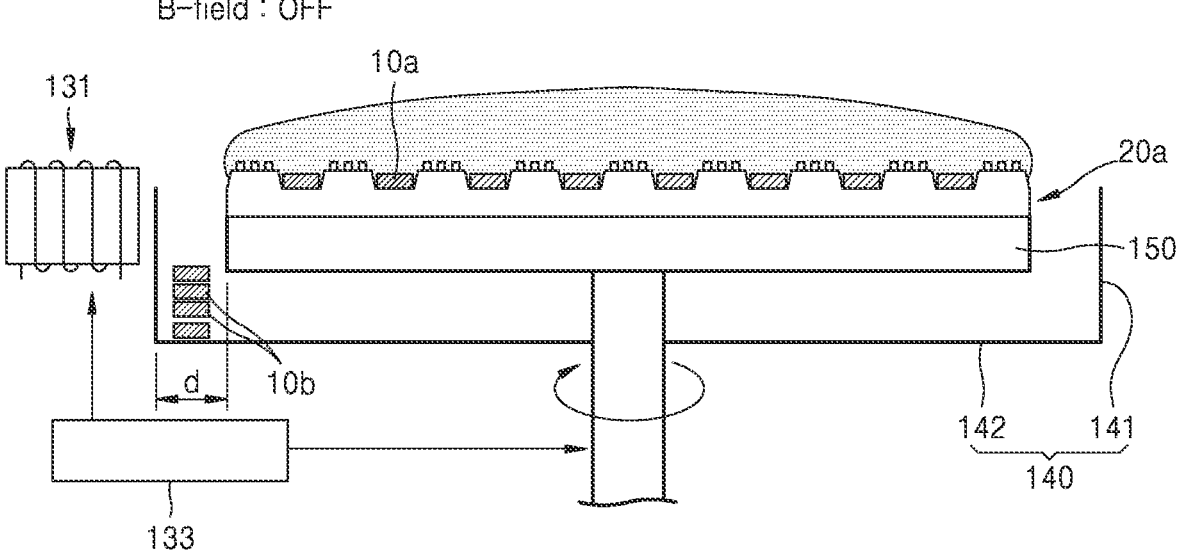
FIG. 10C is a diagram illustrating a state of collecting a second micro-semiconductor chip according to an embodiment.

FIG. 10C is a diagram illustrating a state where the second micro-semiconductor chip 10b is collected according to an embodiment. As illustrated in FIG. 10C, the second micro-semiconductor chip 10b moved by the magnetic field may be collected in the space between the transfer substrate 20a and the lateral surface 141 of the chamber 140 while not touching the lateral surface 141 of the chamber 140. The second micro-semiconductor chip 10b collected in the chamber 140 may be reused.

As the magnetic field generator 131 removes the second micro-semiconductor chip 10b from the transfer substrate 20a while not directly contacting the micro-semiconductor chips 10 and the transfer substrate 20a, the micro-semiconductor chips 10 and the transfer substrate 20a may be prevented from being damaged. Undamaged micro-semiconductor chips 10 may be collected and reused.

Although the magnetic field generator 131 is described as providing a magnetic field in a direction parallel with the upper surface S of the transfer substrate 20a, the disclosure is not limited thereto. The magnetic field generator 131 may provide a magnetic field in a direction perpendicular to the transfer substrate 20a.

Figure 11A:
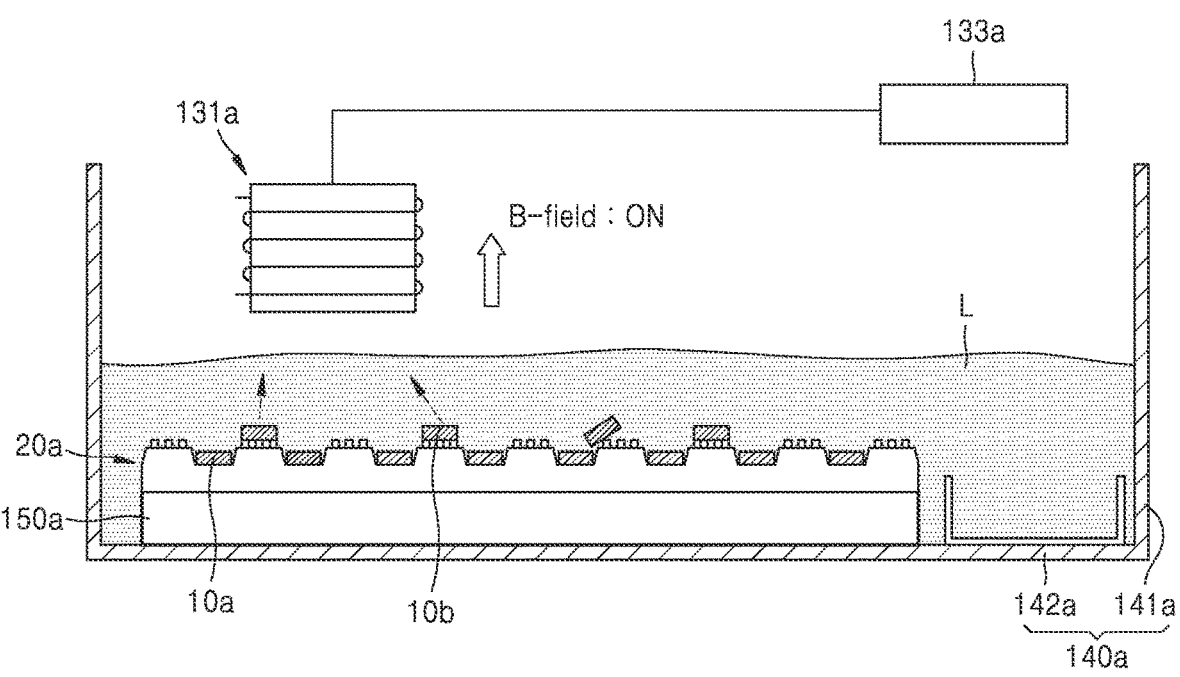
FIG. 11A is a diagram illustrating a magnetic field generator that provides a magnetic field in a vertical direction of a transfer substrate according to an embodiment.

FIGS. 11A, 11B, 11C and 11D are diagrams illustrating a method of removing the second micro-semiconductor chip 10b by providing a magnetic field in the direction perpendicular to the transfer substrate 20a according to an embodiment. With reference to FIG. 11A, the transfer substrate 20a may be arranged on a support member 150a inside a chamber 140a, and liquid may be supplied to the chamber 140a. A magnetic field generator 131a may provide a magnetic field in a direction perpendicular to the upper surface S of the transfer substrate 20a. The magnetic field generator 131a may provide to the transfer substrate 20a a magnetic field for moving the second micro-semiconductor chips 10b not arranged in the grooves G of the transfer substrate 20a while not moving the first micro-semiconductor chips 10a arranged in the grooves G of the transfer substrate 20a.

The intensity of the magnetic field may be determined by a distance between the magnetic field generator 131a and the transfer substrate 20a, an intensity of an electric signal applied to the magnetic field generator 131a, magnetic properties of the magnetic field generator 131a, and a surface tension of the liquid L, etc. In addition, the adhesive force or the surface energy density of the grooves G of the transfer substrate 20a may be greater than the adhesive force of the surface energy density of the upper surface S of the transfer substrate 20a. For example, the grooves G may be surface-treated such that the adhesive force or the surface energy density of the grooves G is greater than the adhesive force or the surface energy density of the upper surface S, or a physical pattern may be formed on the upper surface S. In this manner, the adhesive force between the first micro-semiconductor chips 10a arranged in the grooves G of the transfer substrate 20a and the transfer substrate 20a may be greater than the adhesive force between the second micro-semiconductor chips 10b not arranged in the grooves G of the transfer substrate 20a and the transfer substrate 20a.

When the magnetic field is provided to the transfer substrate 20a, the second micro-semiconductor chips 10b may move in a direction parallel with the magnetic field, i.e., towards the magnetic field generator 131a. When the attractive force of the magnetic field generator 131a to the first micro-semiconductor chips 10a is less than the adhesive force between the first micro-semiconductor chips 10a and the transfer substrate 20a, the first micro-semiconductor chips 10a may not be moved by the magnetic field.

As the second micro-semiconductor chips 10b do not leave the liquid L due to the surface tension of the liquid L, they may not contact the magnetic field generator 131a. That is, the magnetic field generator 131a may provide the magnetic field to the transfer substrate 20a such that only the second micro-semiconductor chips 10b may move in the liquid L.

Figure 11B:
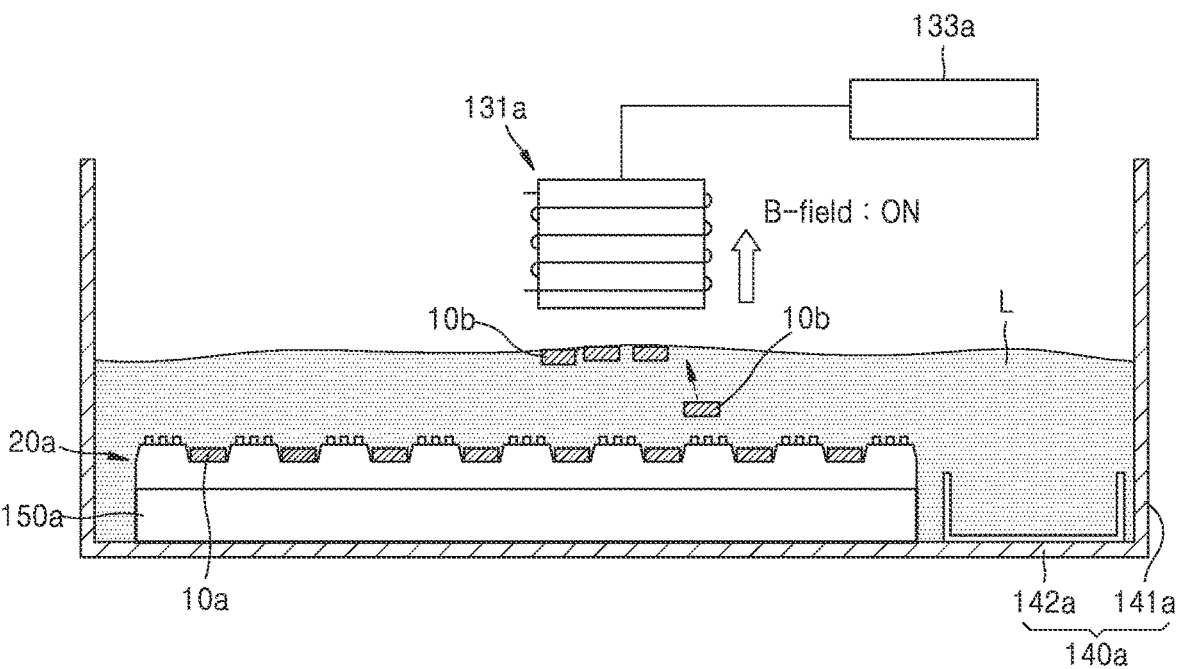
FIG. 11B is a diagram illustrating a magnetic field generator that moves in a direction parallel with a transfer substrate according to an embodiment.

With reference to FIG. 11B, an actuator 133a may move the magnetic field generator 131a towards a lateral surface 141a of the chamber 140a. The magnetic field generator 131a may move the second micro-semiconductor chips 10b which have been moved towards the magnetic field generator 131a to the lateral surface 141a of the chamber 140a. In addition, the magnetic field generator 131a may move other second micro-semiconductor chips 10b arranged in areas other than the grooves G of the transfer substrate 20a towards the magnetic field generator 131a. That is, the second micro-semiconductor chips 10b which spread over the transfer substrate 20a may be collected towards the magnetic field generator 131a and be moved in correspondence with the movement of the magnetic field generator 131a.

Figure 11C:
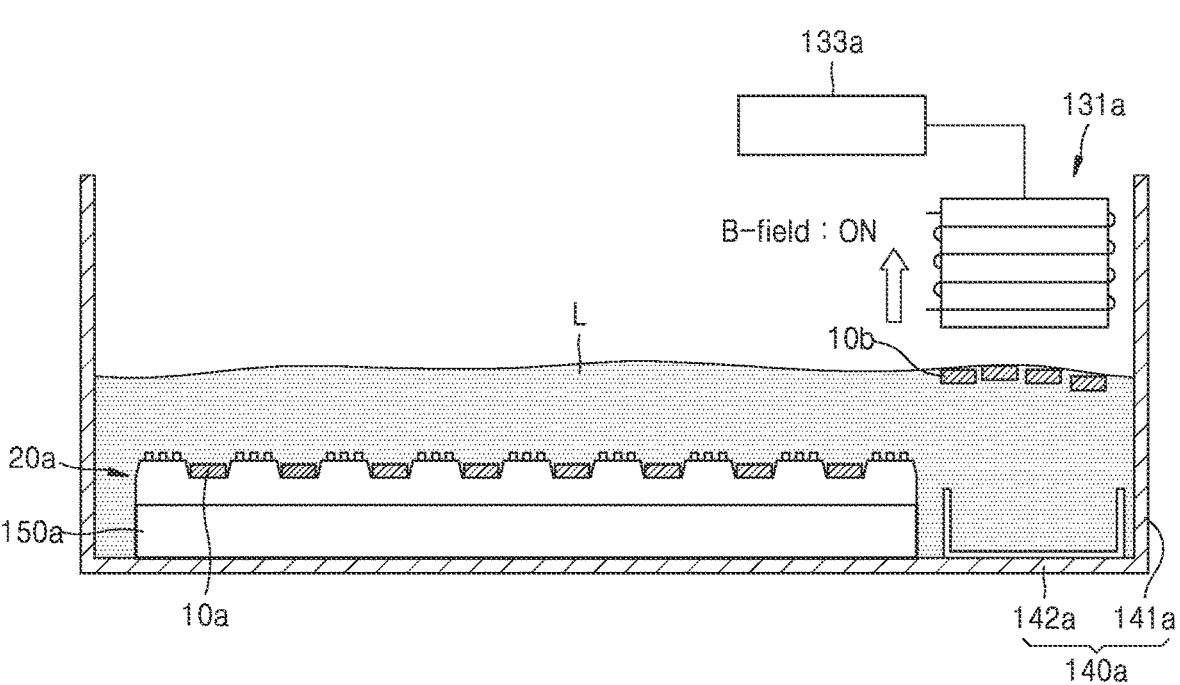
FIG. 11C is a diagram illustrating a magnetic field generator that collects a second micro-semiconductor chip according to an embodiment.
Figure 11D:
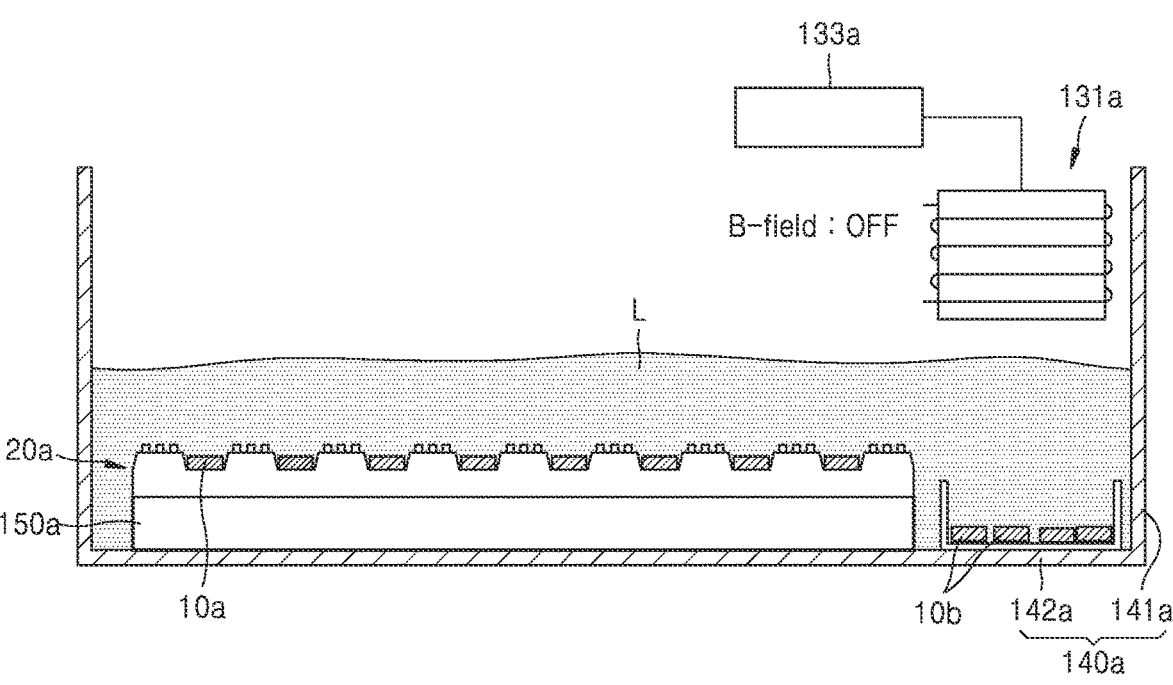
FIG. 11D is a diagram illustrating a magnetic field generator that separates a second micro-semiconductor chip according to an embodiment.

With reference to FIG. 11C, the second micro-semiconductor chip 10b may be moved to the space between the transfer substrate 20a and the lateral surface 141a of the chamber 140a. Then, with reference to FIG. 11D, the magnetic field generator 131a may terminate the provision of magnetic field. The second micro-semiconductor chip 10b may be moved to the bottom surface 142a of the chamber 140a due to the gravity.

FIGS. 12A, 12B, 12C and 12D are diagrams illustrating a method of removing the second micro-semiconductor chip 10b by providing a magnetic field in the direction perpendicular to the transfer substrate 20a according to another embodiment. When comparing FIGS. 11A and 12A, the liquid L may be arranged only on the transfer substrate 20a in FIG. 12A. The magnetic field generator 131a may provide a magnetic field in a direction perpendicular to the upper surface S of the transfer substrate 20a. The chip cleaning module 130 may further include a separation film 134 arranged between the magnetic field generator 131a and the second micro-semiconductor chip 10b. The separation film 134 may include plastic, cloth, etc. which may be easily separated from the second micro-semiconductor chip 10b. The separation film 134 may prevent a direct contact between the second micro-semiconductor chip 10b and the magnetic field generator 131 and thus prevent the second micro-semiconductor chip 10b from being damaged.

The magnetic field generator 131a may provide to the transfer substrate 20a a magnetic field for moving the second micro-semiconductor chips 10b not arranged in the grooves G of the transfer substrate 20a while not moving the first micro-semiconductor chips 10a arranged in the grooves G of the transfer substrate 20a.

The intensity of the magnetic field may be determined by a distance between the magnetic field generator 131a and the transfer substrate 20a, an intensity of an electric signal applied to the magnetic field generator 131a, magnetic properties of the magnetic field generator 131a, and a surface tension of the liquid L, etc. In addition, the adhesive force or the surface energy density of the grooves G of the transfer substrate 20a may be greater than the adhesive force of the surface energy density of the upper surface S of the transfer substrate 20a. For example, the grooves G may be surface-treated such that the adhesive force or the surface energy density of the grooves G is greater than the adhesive force or the surface energy density of the upper surface S, or a physical pattern may be formed on the upper surface S. In this manner, the adhesive force between the first micro-semiconductor chips 10a arranged in the grooves G of the transfer substrate 20a and the transfer substrate 20a may be greater than the adhesive force between the second micro-semiconductor chips 10*b* not arranged in the grooves G of the transfer substrate 20*a* and the transfer substrate 20*a*.

When the magnetic field is provided to the transfer substrate 20*a*, the second micro-semiconductor chips 10*b* may move in a direction parallel with the magnetic field, i.e., towards the magnetic field generator 131*a*. When the attractive force of the magnetic field generator 131*a* to the first micro-semiconductor chips 10*a* is less than the adhesive force between the first micro-semiconductor chips 10*a* and the transfer substrate 20*a*, the first micro-semiconductor chips 10*a* may not be moved by the magnetic field.

The second micro-semiconductor chip 10*b* may move outside the liquid L and contact the separation film 134.

Figure 12A:
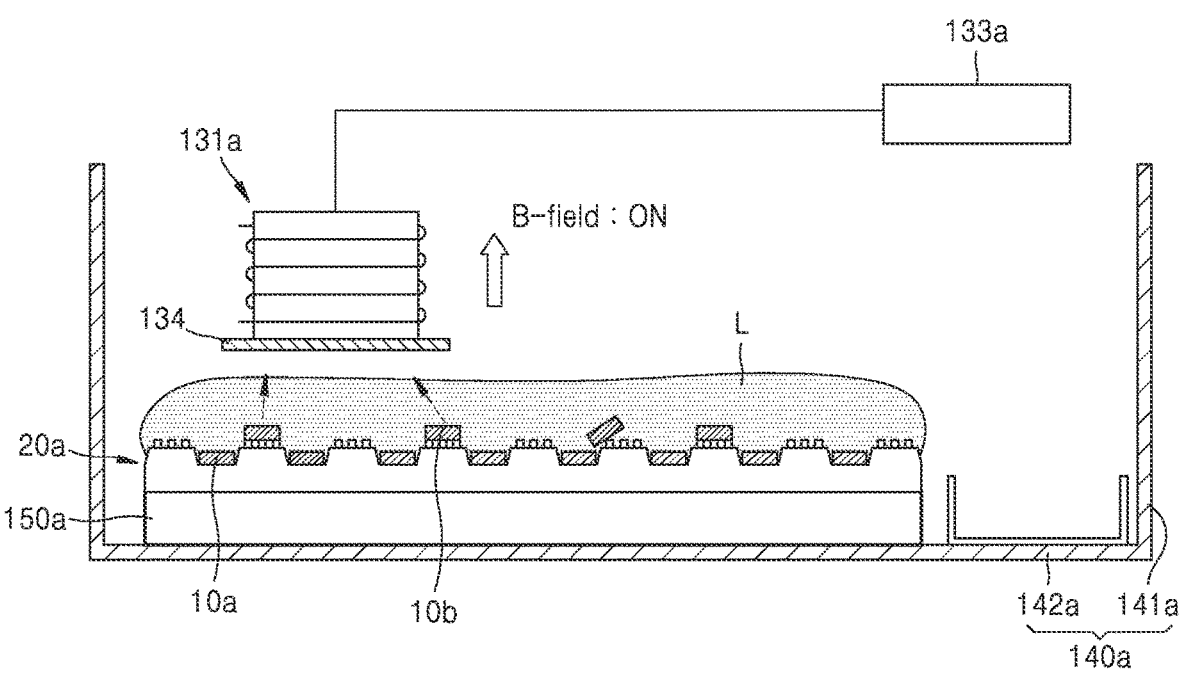
FIGS. 12A, 12B, 12C and 12D are diagrams illustrating a magnetic field generator that removes a second micro-semiconductor chip according to another embodiment.
Figure 12B:
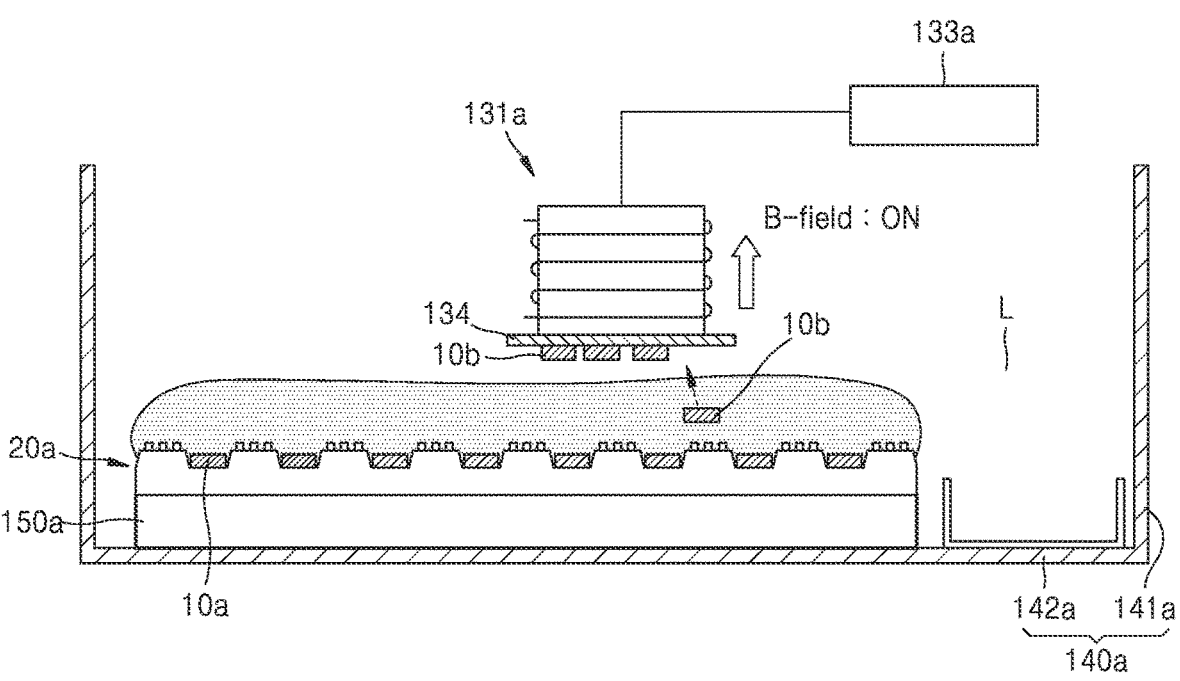

With reference to FIG. 12B, the actuator 133*a* may move the magnetic field generator 131*a* towards the lateral surface 141*a* of the chamber 140*a*. The magnetic field generator 131*a* may move the second micro-semiconductor chips 10*b* contacting the separation film 134 to the lateral surface 141*a* of the chamber 140*a*. In addition, the magnetic field generator 131*a* may move other second micro-semiconductor chips 10*b* arranged in areas other than the grooves G of the transfer substrate 20*a* towards the magnetic field generator 131*a*. That is, the second micro-semiconductor chips 10*b* which spread over the transfer substrate 20*a* may be collected towards the magnetic field generator 131*a* and be moved in correspondence with the movement of the magnetic field generator 131*a*.

Figure 12C:
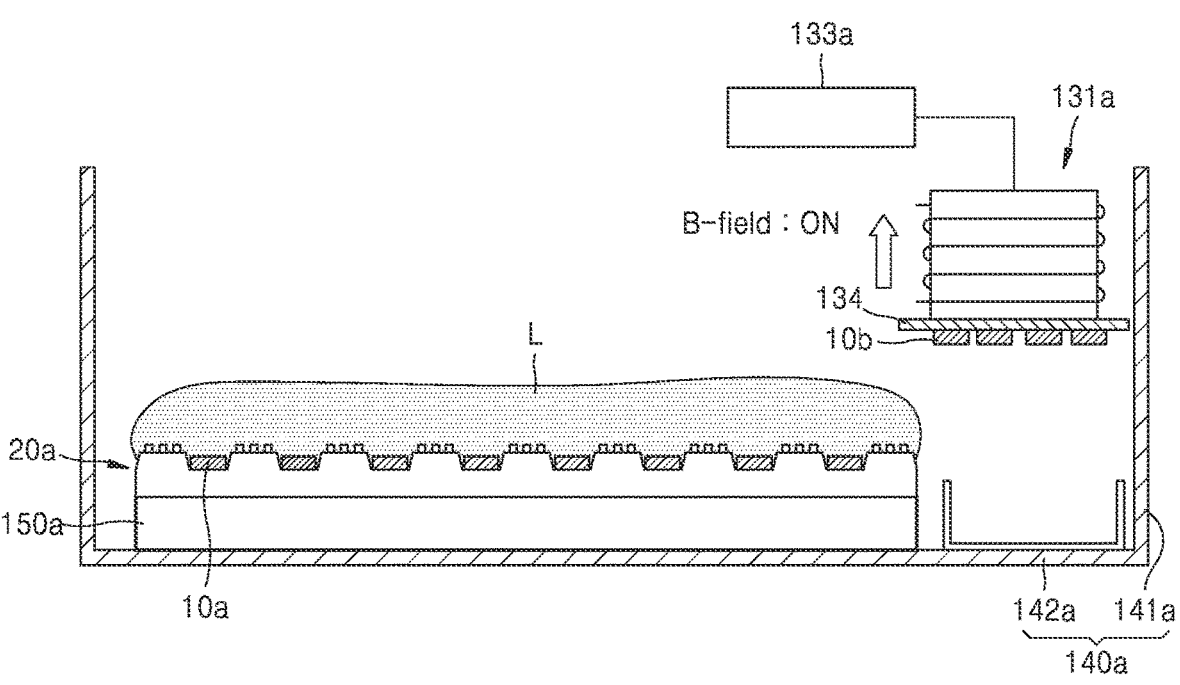
Figure 12D:
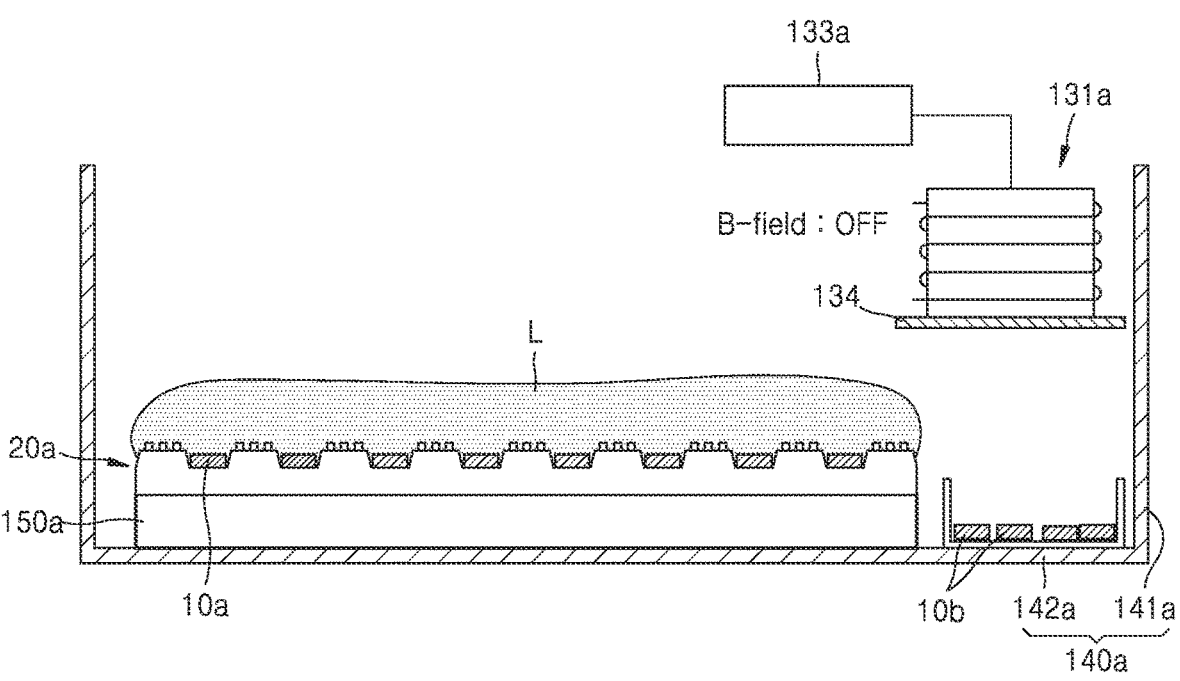

With reference to FIG. 12C, the second micro-semiconductor chip 10*b* may be moved to the space between the transfer substrate 20*a* and the lateral surface 141*a* of the chamber 140*a*. Then, with reference to FIG. 12D, the magnetic field generator 131*a* may terminate the provision of magnetic field. The second micro-semiconductor chip 10*b* may be moved to the bottom surface 142*a* of the chamber 140*a* due to the gravity. Although FIG. 12D illustrates that the magnetic field generator 131*a* terminates the provision of the magnetic field, the disclosure is not limited thereto. After moving the magnetic field generator 131*a* to a different space than the chamber 140*a*, the second micro-semiconductor chip 10*b* may be separated from the separation film 134. Although the embodiments describe the magnetic field generators (131, 131*a*) as being arranged outside the liquid L, the disclosure is not limited thereto. The magnetic field generator 131 may be arranged inside the liquid L.

Figure 13:
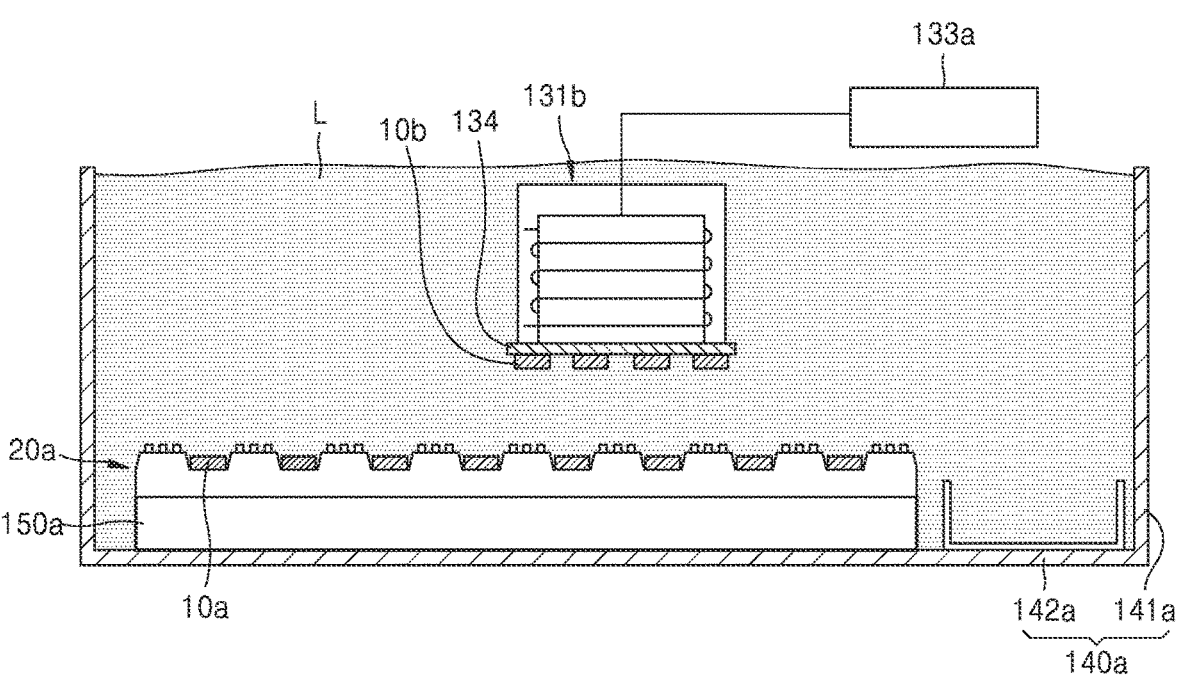
FIG. 13 is a diagram of a magnetic field generator arranged in liquid according to an embodiment.

FIG. 13 is a diagram of a magnetic field generator 131*b* arranged in the liquid L according to an embodiment. As illustrated in FIG. 13, the magnetic field generator 131*b* may be arranged in the liquid L and move the second micro-semiconductor chips 10*b*. The chip cleaning module 130 may further include the separation film 134 arranged between the magnetic field generator 131*b* and the second micro-semiconductor chip 10*b*. The separation film 134 may include plastic, cloth, etc., which may be easily separated from the second micro-semiconductor chip 10*b*. The separation film 134 may prevent a direct contact between the second micro-semiconductor chip 10*b* and the magnetic field generator 131 and thus prevent the second micro-semiconductor chip 10*b* from being damaged.

As the magnetic field generator 131*b* provides a magnetic field in a direction perpendicular to the upper surface S of the transfer substrate 20*a*, the friction between the moving second micro-semiconductor chips 10*b* and the first micro-semiconductor chips 10*a* or the transfer substrate 20*a* may be reduced.

Although the surface of the magnetic field generator (131, 131*a*, and 131*b*) that generates a magnetic field is described as greater than the size of the second micro-semiconductor chip 10*b*, the disclosure is not limited thereto. The magnetic field generator may include a cell C that is smaller than the size of the second micro-semiconductor chip 10*b*.

Figure 14:
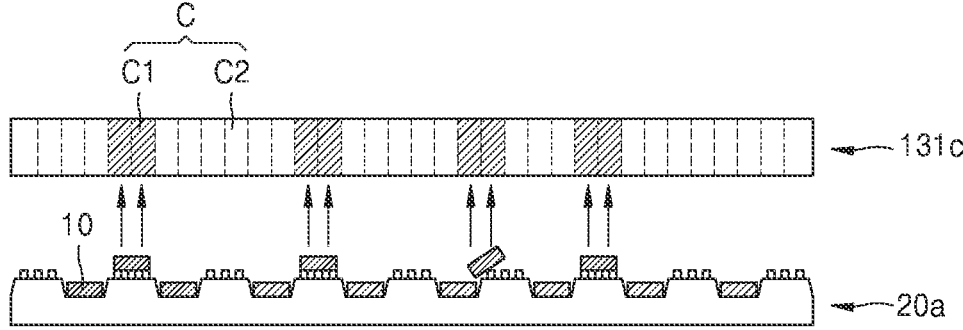
FIG. 14 is a diagram of a magnetic field generator including a plurality of cells according to an embodiment.

FIG. 14 is a diagram of a magnetic field generator 131*c* including a plurality of cells C according to an embodiment. With reference to FIG. 14, the magnetic field generator 131*c* may include the plurality of cells C. The cell C may independently generate a magnetic field (i.e., the magnetic field generator 131*c* may generate a plurality of individual magnetic fields). After the magnetic field generator 131*c* is arranged to face the transfer substrate 20*a*, only a cell C1 corresponding to a position in which the second micro-semiconductor chip 10*b* is placed may generate a magnetic field. Then, as the second micro-semiconductor chip 10*b* moves towards the magnetic field generator 131, the second micro-semiconductor chip 10*b* may be easily removed from the transfer substrate 20*a*. Although the cell C is described as independently generating a magnetic field, the disclosure is not limited thereto. The cell C may independently generate an electric field.

The transfer substrate 20*a* applied to the chip wet-transferring device 100 according to an embodiment may include the plurality of grooves G. Moreover, the grooves G and an upper surface S of the transfer substrate 20*a* may have different adhesive forces or surface energy densities from each other. The adhesive force or the surface energy density may be changed by the surface-treating. For example, the grooves G may be surface-treated with a hydrophilic material, and the upper surface S may be surface-treated with a hydrophobic material. Alternatively, the upper surface S of the transfer substrate 20*a* may be physically patterned to vary the adhesive force or the surface energy density.

The aforementioned wet transferred micro-semiconductor chips may be used in manufacturing electronic devices. When the micro-semiconductor chip 10 is a light-emitting diode, a display device may be manufactured using the wet-transferred micro-semiconductor chip 10.

After providing and aligning an amount of micro-semiconductor chips, the remaining micro-semiconductor chips may be removed without damage.

The removed micro-semiconductor chip may be reused.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A chip wet-transferring device comprising:
a chamber;
a support member provided in the chamber and configured to support a transfer substrate comprising a plurality of grooves on an upper surface thereof and on which a plurality of micro-semiconductor chips are disposed; and
a magnetic field generator facing the upper surface of the transfer substrate and configured to remove, from the upper surface of the transfer substrate, a first micro-semiconductor chip, from among the plurality of micro-semiconductor chips, that is disposed, prior to activation of the magnetic field generator, on the upper surface of the transfer substrate and partially inside of the plurality of grooves or between two grooves of the plurality of grooves by generating a magnetic field that moves the first micro-semiconductor chip in a direction substantially parallel with the upper surface of the transfer substrate.

2. The chip wet-transferring device of claim 1, wherein the magnetic field generator is further configured to move the first micro-semiconductor chip to a space between the transfer substrate and a lateral surface of the chamber by using the magnetic field.

3. The chip wet-transferring device of claim 1, wherein a size of a space between the transfer substrate and a lateral surface of the chamber is greater than a size of the first micro-semiconductor chip.

4. The chip wet-transferring device of claim 1, wherein the magnetic field generator is further configured to provide the magnetic field in the direction that is substantially parallel with the upper surface of the transfer substrate.

5. The chip wet-transferring device of claim 1, wherein the magnetic field generator is further configured to provide the magnetic field in a direction substantially perpendicular to the upper surface of the transfer substrate.

6. The chip wet-transferring device of claim 5, further comprising an actuator configured to move the magnetic field generator in the direction that is substantially parallel with the upper surface of the transfer substrate.

7. The chip wet-transferring device of claim 5, further comprising a separation film provided under the magnetic field generator.

8. The chip wet-transferring device of claim 1, wherein the magnetic field generator is provided outside the chamber.

9. The chip wet-transferring device of claim 1, wherein the magnetic field generator is provided outside of a lateral surface of the chamber.

10. The chip wet-transferring device of claim 1, wherein the magnetic field generator comprises an electromagnet configured to generate the magnetic field based on an applied electric signal.

11. The chip wet-transferring device of claim 1, wherein the magnetic field generator comprises a plurality of cells, and each of the plurality of cells is configured to independently generate a magnetic field.

12. The chip wet-transferring device of claim 11, wherein a size of a cell of the plurality of cells is less than a size of the first micro-semiconductor chip.

13. The chip wet-transferring device of claim 1, further comprising a liquid supply module configured to supply liquid to the transfer substrate and that at least partially covers the first micro-semiconductor chip.

14. The chip wet-transferring device of claim 13, wherein the liquid supply module is further configured to supply the liquid such that a distance from the upper surface of the transfer substrate to a surface of the liquid is greater than a size of the first micro-semiconductor chip.

15. The chip wet-transferring device of claim 1, wherein at least one of the support member and the magnetic field generator is configured to perform at least one of a rotary motion, a tilt motion, a vibratory motion, a vertical motion, and a horizontal motion.

16. The chip wet-transferring device of claim 1, wherein a first adhesive force at the upper surface of the transfer substrate or a first surface energy density at the upper surface of the transfer substrate is less than a second adhesive force at least one groove of the plurality of grooves or a second surface energy density at the at least one groove of the plurality of grooves.

17. The chip wet-transferring device of claim 1, wherein a convex pattern is formed on the upper surface of the transfer substrate.

18. The chip wet-transferring device of claim 17, wherein a width of the convex pattern is less than a width of the first micro-semiconductor chip.

19. The chip wet-transferring device of claim 1, wherein the first micro-semiconductor chip is a light-emitting device comprising an electrode provided on a surface of the light-emitting device, and wherein the electrode comprises a magnetic material.

20. A method of chip wet-transferring, the method comprising:

providing a transfer substrate comprising a plurality of grooves on an upper surface thereof and on which a plurality of micro-semiconductor chips are disposed;

supporting the transfer substrate with a support member;

accommodating the support member in a chamber; and removing, by a magnetic field generator facing the upper surface of the transfer substrate, a first micro-semiconductor chip, from among the plurality of micro-semiconductor chips, that is disposed, prior to activation of the magnetic field generator, on the upper surface of the transfer substrate and partially inside of the plurality of grooves or between two grooves of the plurality of grooves by generating a magnetic field that moves the first micro-semiconductor chip in a direction substantially parallel with the upper surface of the transfer substrate.

\* \* \* \* \*